United States Patent
Li et al.

(10) Patent No.: US 12,191,458 B2
(45) Date of Patent: Jan. 7, 2025

(54) PROTECTION METHOD AND DEVICE FOR SECONDARY BATTERY, SECONDARY BATTERY, BATTERY MODULE, BATTERY PACK, AND ELECTRIC APPARATUS

(71) Applicant: CONTEMPORARY AMPEREX TECHNOLOGY (HONG KONG) LIMITED, Hong Kong (CN)

(72) Inventors: Ting Li, Ningde (CN); Haizu Jin, Ningde (CN); Shaojun Niu, Ningde (CN); Huaichao Tang, Ningde (CN); Longqing Peng, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 0 days.

(21) Appl. No.: 18/592,946

(22) Filed: Mar. 1, 2024

(65) Prior Publication Data
US 2024/0258584 A1  Aug. 1, 2024

Related U.S. Application Data (63) Continuation of application No. PCT/CN2022/099137, filed on Jun. 16, 2022.

(51) Int. Cl.
*H01M 10/42* (2006.01)
*C23C 16/02* (2006.01)
*C23C 16/34* (2006.01)
(Continued)

(52) U.S. Cl.
CPC ..... *H01M 10/4235* (2013.01); *C23C 16/0245* (2013.01); *C23C 16/345* (2013.01);
(Continued)

(58) Field of Classification Search
CPC .......... H01M 10/4235; H01M 10/0404; C23C 16/0245; C23C 16/345; C23C 16/401;
(Continued)

(56) References Cited

FOREIGN PATENT DOCUMENTS

| CN | 104805390 A | 7/2015 |
|---|---|---|
| CN | 105531841 A | 4/2016 |

(Continued)

OTHER PUBLICATIONS

Machine translation, CN-212648287-U (Year: 2021).*
(Continued)

*Primary Examiner* — Michael G Miller
(74) *Attorney, Agent, or Firm* — ANOVA LAW GROUP, PLLC (57) ABSTRACT

A protection method for a secondary battery includes evacuating the secondary battery through an injection opening of the secondary battery to within 100 kPa, introducing a first reactant into the secondary battery through the injection opening until a pressure of the secondary battery rises by more than 1 Pa and maintaining the pressure for more than 1 ms, evacuating the secondary battery through the injection opening to within 100 kPa, and introducing a second reactant into the secondary battery through the injection opening until the pressure rises by more than 1 Pa and maintaining the pressure for more than 1 ms, thereby forming a protection layer on an internal surface of the secondary battery.

18 Claims, 3 Drawing Sheets

(51) Int. Cl.
*C23C 16/40* (2006.01)
*C23C 16/44* (2006.01)
*C23C 16/505* (2006.01)
*C23C 16/56* (2006.01)
*H01M 10/04* (2006.01)

(52) U.S. Cl.
CPC .......... *C23C 16/401* (2013.01); *C23C 16/403* (2013.01); *C23C 16/405* (2013.01); *C23C 16/407* (2013.01); *C23C 16/4408* (2013.01); *C23C 16/505* (2013.01); *C23C 16/56* (2013.01); *H01M 10/0404* (2013.01)

(58) Field of Classification Search
CPC ................ C23C 16/403; C23C 16/405; C23C 16/407; C23C 16/4408; C23C 16/505; C23C 16/56
See application file for complete search history.

(56) References Cited

FOREIGN PATENT DOCUMENTS

| CN | 112490433 A | * | 3/2021 |
| CN | 212648287 U | * | 3/2021 |
| JP | 2011080135 A | | 4/2011 |
| JP | 2015185348 A | | 10/2015 |

OTHER PUBLICATIONS

Machine translation, CN-112490433-A (Year: 2021).*
The World Intellectual Property Organization (WIPO) International Search Report and Written Opinion for PCT/CN2022/099137 Mar. 13, 2023 14 Pages (including translation).

* cited by examiner

PROTECTION METHOD AND DEVICE FOR SECONDARY BATTERY, SECONDARY BATTERY, BATTERY MODULE, BATTERY PACK, AND ELECTRIC APPARATUS

CROSS-REFERENCE TO RELATED APPLICATION

This application is a continuation of International Application No. PCT/CN2022/099137, filed on Jun. 16, 2022, the entire content of which is incorporated herein by reference.

TECHNICAL FIELD

This application relates to the field of secondary battery technologies, and in particular to a protection method and device for a secondary battery, a secondary battery, a battery module, a battery pack, and an electric apparatus.

BACKGROUND

In recent years, secondary batteries are in increasingly wide use. Secondary batteries are widely used in energy storage power supply systems such as hydroelectric power plants, thermal power plants, wind power plants, and solar power plants, and many other fields including electric tools, electric bicycles, electric motorcycles, electric vehicles, military equipment, and aerospace. Due to great development of the secondary batteries, higher requirements are imposed on energy density, cycling performance, safety performance, and the like of the secondary batteries. However, the safety performance of existing secondary batteries needs further improvement.

SUMMARY

This application has been made in view of the foregoing issues. An objective of this application is to provide a protection method for a secondary battery that can simultaneously form a protection layer on internal surface of a secondary battery and especially at the welds, so as to reduce the probability of corrosion and short circuit inside the secondary battery.

To achieve the foregoing purpose, this application provides a protection method and device for a secondary battery, a secondary battery, a battery module, a battery pack, and an electric apparatus.

A first aspect of this application provides a protection method for a secondary battery, where the secondary battery includes an injection opening, and the method includes:

step (1): evacuating the secondary battery through the injection opening to within 100 kPa, optionally to within 100 Pa;

step (2): introducing a first reactant into the secondary battery through the injection opening until the pressure rises by more than 1 Pa, optionally more than 1 kPa, and maintaining the pressure for more than 1 ms, optionally for 0.1 s-600 s; and optionally step (3): evacuating the secondary battery through the injection opening to within 100 kPa, optionally to within 100 Pa; and step (4): introducing a second reactant into the secondary battery through the injection opening until the pressure rises by more than 1 Pa, optionally more than 1 kPa, and maintaining the pressure for more than 1 ms, optionally for 0.1 s-600 s;

thereby forming a protection layer on internal surface of the secondary battery, where
the second reactant is capable of reacting with the first reactant to form the protection layer.

Accordingly, in this application, the gas-solid interface reaction technology is used to protect the internal surface of the secondary battery, and the integrated insulation protection treatment is carried out on the exposed internal surface of the secondary battery, particularly on the surfaces of the welds produced during subsequent assembly, which can reduce the probability of corrosion and short circuit inside the secondary battery, thereby improving the safety performance and corrosion resistance performance of the secondary battery.

In any embodiment, the first reactant includes at least one of a gaseous aluminum compound, silicon compound, tin compound, germanium compound, chromium compound, boron compound, titanium compound, vanadium compound, elemental zinc and zinc compound, zirconium compound, hafnium compound, and tantalum compound; and optionally includes at least one of gaseous $AlCl_3$, trimethylaluminum, $Al(CH_3)_2Cl$, $Al(C_2H_5)_3$, $Al(OC_2H_5)_3$, $(CH_3)_2AlOCH(CH_3)_2$, $(CH_3CH_2)_2AlOC_2H_5$, $Al(CH_3)_2OC_2H_5$, $Al(N(C_2H_5)_2)_3$, $Al(N(CH_3)_2)_3$, $SiCl_4$, $SiCl_2H_2$, $Si_2Cl_6$, $Si(OC_2H_5)_2H_2$, $Si_2H_6$, $Si(OCH_2CH_3)_4$, $Si(OCH_3)_4$, $SiH(OCH_3)_3$, $SiH(OC_2H_5)_3$, $(CH_3)_2Si(OCH_3)_2$, $Si(NCO)_4$, $Si(OC_2H_5)_4$, $H_2N(CH_2)_3Si(OC_2H_5)_3$, $CH_2{=}CHSi(OCH_3)_3$, $(CH_2{=}CH)_3SiOCH_3$, $((CH_3)_3CO)_3SiOH$, $(CH_3CH_2C(CH_3)_2O)_3SiOH$, $SiH[N(CH_3)_2]_3$, $SiH_2[N(CH_3)_2]_2$, $SiH_2[NH(C_4H_9)]_2$, $SiH_2[N(C_2H_5)_2]_2$, $SiH_2[NC_2H_5CH_3]_2$, $SiH_3N(C_4H_9)_2$, $[Si(NHC_2H_5)_3]_2$, $Si(NHC_2H_5)_4$, $SiH_3N(C_3H_7)_2$, $[SiH_2N(C_3H_7)_2]_2$, $Si(N(CH_3)_2)_4$, $(CH_3)_3SiN(CH_3)_2$, $C_7H_{17}NSi$, $C_8H_{20}N_2Si$, $C_8H_{17}NO_2Si$, $C_7H_{18}N_2O_2Si$, $SiCl_3H$, $SnCl_4$, $GeCl_3$, $CrO_2Cl_2$, $BBr_3$, $TiF_4$, $TiCl_4$, $TiI_4$, $Ti(OCH_3)_4$, $Ti(OC_2H_5)_4$, $Ti(N(CH_3)_2)_4$, $Ti(N(C_2H_5)_2)_4$, $Ti(N(CH_3)(C_2H_5))_4$, $VOCl_3$, $Zn$, $ZnCl_2$, $Zn(CH_3)_2$, $Zn(C_2H_5)_2$, $ZnI_2$, $ZrCl_4$, $ZrI_4$, $Zr(N(CH_3)_2)_4$, $Zr(N(C_2H_5)_2)_4$, $Zr(N(CH_3)(C_2H_5))_4$, $HfCl_4$, $HfI_4$, $Hf(NO_3)_4$, $Hf(N(CH_3)(C_2H_5))_4$, $Hf(N(CH_3)_2)_4$, $Hf(N(C_2H_5)_2)_4$, $TaCl_5$, $TaF_5$, $TaI_5$, $Ta(O(C_2H_5))_5$, $Ta(N(CH_3)_2)_5$, $Ta(N(C_2H_5)_2)_5$, and $TaBr_5$.

In any embodiment, the second reactant includes at least one of and/or plasma of at least one of $H_2O$, $O_2$, $O_3$, $H_2$, S, $(NH_4)_2S$, $H_2Se$, Se, $H_2Te$, Te, HF, $TiF_4$, $TaF_5$, $C_2H_4$, $CHCl_3$, $H_2O_2$, $NO_2$, $N_2O$, $NH_3$, $N_2H_4$, HCOOH, $CH_3COOH$, and $H_2S$.

With the first reactant and the second reactant selected, the composition of the protection layer can be controlled and the protection layer is uniformly dense and has a strong adhesion with the substrate, thereby reducing the probability of corrosion and short circuit inside the secondary battery.

In any embodiment, in the steps (1)-(4), the temperature of the secondary battery is maintained at a temperature between 0° C. and 200° C. With the temperature maintained within the given range, the secondary battery thereby adapts to physical parameters of the specific reactants.

In any embodiment, the steps (1)-(4) are repeated 1-100,000 times. Controlling the number of repetitions of the steps (1)-(4) can control the thickness of the protection layer.

In any embodiment, the steps (1)-(2) are first repeated 1-10 times, and then the steps (1)-(4) are repeated 1-100,000 times. As a result, the moisture inside the secondary battery can be fully utilized as a reactant.

In any embodiment, the first reactant and the second reactant are introduced by using a carrier gas, the carrier gas including at least one of nitrogen, argon, carbon dioxide, and helium. The usage of the carrier gas to introduce the first reactant and the second reactant may promote a smoother entry of the reactants into the secondary battery.

In any embodiment, prior to the step (1), the protection method further includes a step of pre-treating the internal surface of the secondary battery, including introducing at least one of and/or plasma of at least one of Ar, $N_2$, $H_2O$, $O_2$, $O_3$, $H_2$, S, $(NH_4)_2S$, $H_2Se$, Se, $H_2Te$, Te, HF, $TiF_4$, $TaF_5$, $C_2H_4$, $CHCl_3$, $H_2O_2$, $NO_2$, $N_2O$, $NH_3$, $N_2H_4$, HCOOH, $CH_3COOH$, and $H_2S$ into the secondary battery through the injection opening. The pre-treatment step can improve the adhesion between the protection layer and the substrate.

In any embodiment, the secondary battery further includes an electrode assembly, tabs, adapting pieces, a top cover assembly, and a housing, where the protection layer is formed at connections between the tabs and the adapting pieces, at connections between the adapting pieces and the top cover assembly, at the connection between the top cover assembly and the housing, at the inner wall of the top cover assembly, on the adapting pieces, at the inner wall of the housing, and at the outer peripheral surface of the electrode assembly. The protection layer can reduce the heat generated during short circuit contact to reduce safety hazards and act as a physical barrier to prevent the occurrence of corrosion.

In any embodiment, the protection layer includes at least one of carbides, nitrides, sulfides, oxides, fluorides, selenides, and tellurides of aluminum, silicon, tin, germanium, chromium, boron, titanium, vanadium, zinc, zirconium, hafnium, or tantalum, and optionally includes at least one of aluminum oxide, silicon oxide, silicon nitride, titanium oxide, and zinc oxide. With the controlled composition of the protection layer, the protection layer can be made more uniformly dense and the adhesion between the protection layer and the substrate can be increased.

In any embodiment, the protection method further includes a step of purging the secondary battery with a purge gas after the step (2) and/or the step (4), the purge gas including at least one of $N_2$, Ar, He, $CO_2$, and the second reactant. The purging step can further improve the purity and adhesion of the protection layer.

In any embodiment, the thickness of the protection layer is 1 nm-1000 μm, optionally 50 nm-500 nm. With the protection layer controlled in a suitable thickness range, the overall mass energy density and volumetric energy density of the secondary battery are barely affected while insulation and protection are provided.

In any embodiment, the protection method further includes a step of performing post-treatment on the protection layer, including temperature annealing treatment, plasma annealing treatment, or light radiation annealing treatment in a specific atmosphere, where the specific atmosphere includes at least one of and/or plasma of at least one of pyridine, $N_2$, Ar, He, $CO_2$, and the second reactant. The post-treatment step can further improve the quality of the protection layer.

A second aspect of this application further provides a protection device for a secondary battery, including:
a cavity for accommodating the secondary battery;
a first reactant tank for storing a first reactant;
a second reactant tank for storing a second reactant;
a vacuum pump;
a pressure gauge for real-time monitoring of the pressure within the secondary battery; and
a flow regulating valve for regulating the flow rate of the first reactant and the second reactant;
the second reactant being capable of reacting with the first reactant to form a protection layer; where the first reactant tank and the second reactant tank are respectively in communication with an injection opening of the secondary battery accommodated in the cavity for introducing the first reactant and the second reactant into the secondary battery; and the vacuum pump is in communication with the injection opening of the secondary battery accommodated in the cavity for evacuating the secondary battery.

Thus, the reactants can be mixed and reacted inside the secondary battery.

A third aspect of this application provides a secondary battery, the secondary battery being a secondary battery obtained through protection using the protection method for a secondary battery according to the first aspect of this application.

A fourth aspect of this application provides a battery module including the secondary battery according to the third aspect of this application.

A fifth aspect of this application provides a battery pack including the battery module according to the fourth aspect of this application.

A sixth aspect of this application provides an electric apparatus, including at least one of the secondary battery according to the third aspect of this application, the battery module according to the fourth aspect of this application, or the battery pack according to the fifth aspect of this application.

The battery module, the battery pack, and the electric apparatus in this application include the secondary battery in this application, and therefore have at least advantages that are the same as those of the secondary battery.

DESCRIPTION OF EMBODIMENTS

The following specifically discloses embodiments of a protection method and device for a secondary battery, a secondary battery, a battery module, a battery pack, and an electric apparatus in this application with appropriate reference to detailed descriptions of accompanying drawings. However, there may be cases where unnecessary detailed descriptions are omitted. For example, detailed descriptions of well-known matters and repeated descriptions of actually identical structures have been omitted. This is to avoid unnecessarily prolonging the following description, for case of understanding by persons skilled in the art. In addition, the accompanying drawings and the following descriptions are provided for persons skilled in the art to fully understand this application and are not intended to limit the subject matter recorded in the claims.

"Ranges" disclosed in this application are defined in the form of lower and upper limits. A given range is defined by one lower limit and one upper limit selected, where the selected lower and upper limits define boundaries of that particular range. Ranges defined in this method may or may not include end values, and any combinations may be used, meaning any lower limit may be combined with any upper limit to form a range. For example, if ranges of 60-120 and 80-110 are provided for a specific parameter, it is understood that ranges of 60-110 and 80-120 can also be envisioned. In addition, if minimum limit values of a range are given as 1 and 2, and maximum limit values of the range are given as 3, 4, and 5, the following ranges can all be envisioned: 1-3, 1-4, 1-5, 2-3, 2-4, and 2-5. In this application, unless otherwise stated, a value range of "a-b" is a short representation of any combination of real numbers between a and b, where both a and b are real numbers. For example, a value range of "0-5" means that all real numbers in the range of "0-5" are listed herein, and "0-5" is just a short representation of a combination of these values. In addition, a parameter expressed as an integer greater than or equal to 2 is equivalent to disclosure that the parameter is, for example, an integer among 2, 3, 4, 5, 6, 7, 8, 9, 10, 11, 12, and so on.

Unless otherwise specified, all the embodiments and optional embodiments of this application can be combined with each other to form new technical solutions.

Unless otherwise specified, all the technical features and optional technical features of this application can be combined with each other to form new technical solutions.

Unless otherwise specified, all the steps in this application can be performed in the order described or in random order, and in some embodiments, in the order described. For example, a method including steps (a) and (b) indicates that the method may include steps (a) and (b) performed in order or may include steps (b) and (a) performed in order. For example, that the method may further include step (c) indicates that step (c) may be added to the method in any sequence. For example, the method may include steps (a), (b), and (c), or steps (a), (c), and (b), or steps (c), (a), and (b), or the like.

Unless otherwise specified, "include" and "contain" mentioned in this application are inclusive. For example, the terms "include" and "contain" can mean that other unlisted components may or may not be included or contained.

Unless otherwise specified, in this application, the term "or" is inclusive. For example, the phrase "A or B" means "A, B, or both A and B". More specifically, any one of the following conditions satisfies the condition "A or B": A is true (or present) and B is false (or not present); A is false (or not present) and B is true (or present); or both A and B are true (or present). In this disclosure, the phrases "at least one of A, B, and C" and "at least one of A, B, or C" both mean only A, only B, only C, or any combination of A, B, and C.

With the development of electronic and intelligent devices, the demand for secondary batteries, especially for secondary batteries with high energy density, has become more and more urgent. A lithium-ion battery is used as an example, for which the gradual increase in energy density is often accompanied by an exacerbation of safety hazards. The reasons mainly lie in the following aspects: first, aluminum foil is used as the positive electrode current collector, and its large surface is covered with a positive electrode active material, but its end surface is prone to burrs, increasing the probability of short circuit and the probability of fire and other safety problems; and second, bare metal appears in many places inside the battery and is also easy to cause short circuit, corrosion, and other problems in extreme cases.

Existing disclosed patents and literature mainly provide a single protection for internal elements of the battery, that is, pre-treatment of the electrode plate or separator, followed by assembly of the secondary battery. However, firstly, this step-by-step process method cannot protect the welds produced later, and these unprotected welded areas are still weak links in short circuit protection, posing potential safety hazards. Secondly, the multi-step process increases the number of manufacturing processes and the time spent, while a pre-prepared protection layer is susceptible to damage in subsequent production processes, which will reduce the reliability of protection and increase the probability of defects. Thirdly, the method requires special protection at the tabs before processing in order not to affect the welding, which affects the production efficiency and reduces the yield.

Therefore, in the existing industrial production, finding an efficient and low-cost method that can simultaneously form multiple protective structures inside the battery has become a challenge.

This application provides a protection method for a secondary battery that can simultaneously form a protection layer on internal surface of a secondary battery and especially at the welds, so as to reduce the probability of corrosion and short circuit inside the secondary battery.

In an embodiment of this application, this application provides a protection method for a secondary battery, where the secondary battery includes an injection opening, and the method includes:

step (1): evacuating the secondary battery through the injection opening to within 100 kPa, optionally to within 100 Pa;

step (2): introducing a first reactant into the secondary battery through the injection opening until the pressure rises by more than 1 Pa, optionally more than 1 kPa, and maintaining the pressure for more than 1 ms, optionally for 0.1 s-600 s; and optionally step (3): evacuating the secondary battery through the injection opening to within 100 kPa, optionally to within 100 Pa; and step (4): introducing a second reactant into the secondary battery through the injection opening until the pressure rises by more than 1 Pa, optionally more than 1 kPa, and maintaining the pressure for more than 1 ms, optionally for 0.1 s-600 s;

thereby forming a protection layer on internal surface of the secondary battery, where the second reactant is capable of reacting with the first reactant to form the protection layer.

Although the mechanism is not clear, the applicant has accidentally found that in this application, the gas-solid interface reaction technology is used to protect the internal surface of the secondary battery. Firstly, this allows an integrated treatment on the exposed internal surface of the battery, particularly on the surfaces of the welds produced during subsequent assembly, so as to efficiently carry out insulation protection; and secondly, the protection layer formed on the internal surface can effectively reduce the risk of thermal runaway caused by a short circuit inside the battery and also mitigate corrosion by the internal components of the battery, such as the electrolyte.

Figure 1:
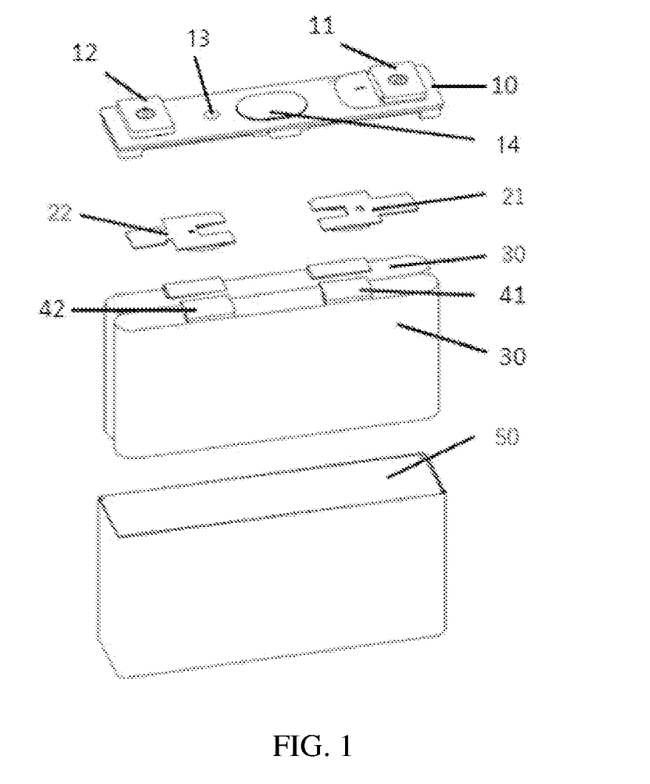
FIG. 1 is an exploded view of a secondary battery according to an embodiment of this application.

FIG. 1 is an exploded view of a secondary battery according to an embodiment of this application. The secondary battery is an unfilled secondary battery (no electrolyte). Referring to FIG. 1, the secondary battery includes an electrode assembly 30, positive and negative electrode tabs 41, 42, positive and negative electrode adapting pieces 21, 22, a top cover assembly 10, and a housing 50. The top cover assembly 10 includes positive and negative electrode poles 11, 12, an injection opening 13, and an explosion-proof valve 14. The housing 50 includes a base plate and a side plate connected onto the base plate, and the base plate and the side plate are enclosed to form an accommodating cavity. The housing 50 has an opening communicating with the accommodating cavity, and the top cover plate 10 can cover the opening to close the accommodating cavity. The electrode assembly 30 is made from a positive electrode plate, a negative electrode plate, and a separator through winding or lamination. The electrode assembly 30 is packaged in the accommodating cavity. There may be one or more electrode assemblies 30 in the secondary battery, and persons skilled in the art may make choices according to specific actual requirements.

In this embodiment of this application, the electrode assembly 30, the positive and negative electrode tabs 41, 42, the positive and negative electrode adapting pieces 21, 22, the top cover assembly 10, and the housing 50 are welded together to form the secondary battery. For example, the electrode assembly 30 is firstly welded to the positive and negative electrode tabs 41, 42 respectively; then the positive and negative electrode tabs 41, 42 are welded to the positive and negative electrode adapting pieces 21, 22 respectively; then the positive and negative electrode adapting pieces 21, 22 are welded to the positive and negative electrode poles 11, 12 of the top cover assembly 10 respectively; and finally the top cover assembly 10 is welded to the housing 50 to obtain the secondary battery.

In some embodiments, the electrode assembly 30 itself has positive and negative electrode tabs 41, 42, which means that the electrode assembly 30 and the positive and negative electrode tabs 41, 42 are of integral structure.

In some implementations, the positive and negative electrode tabs 41 and 42 are aluminum and copper tabs, respectively. The positive and negative electrode adapting pieces 21 and 22 are aluminum and copper adapting pieces, respectively.

In some embodiments, the internal surface of the secondary battery includes the inner wall of the top cover assembly 10, the inner wall of the housing 50, end surfaces of the positive and negative electrode plates, the separator edge, surfaces of the positive and negative electrode tabs 41, 42, welds between the positive and negative electrode tabs 41, 42 and the positive and negative electrode adapting pieces 21, 22, respectively, surfaces of the positive and negative pole adapter pieces 21, 22, welds between the positive and negative electrode adapting pieces 21, 22 and the positive and negative electrode poles 11, 12 of the top cover assembly 10, respectively, and the weld between the top cover assembly 10 and the housing 50.

In some embodiments, the first reactant includes at least one of a gaseous aluminum compound, silicon compound, tin compound, germanium compound, chromium compound, boron compound, titanium compound, vanadium compound, elemental zinc and zinc compound, zirconium compound, hafnium compound, and tantalum compound; and optionally includes at least one of gaseous $AlCl_3$, trimethylaluminum, $Al(CH_3)_2Cl$, $Al(C_2H_5)_3$, $Al(OC_2H_5)_3$, $(CH_3)_2AlOCH(CH_3)_2$, $(CH_3CH_2)_2AlOCH_5$, $Al(CH_3)_2OC_2H_5$, $Al(N(C_2H_5)_2)_3$, $Al(N(CH_3)_2)_3$, $SiCl_4$, $SiCl_2H_2$, $Si_2Cl_6$, $Si(OC_2H_5)_2H_2$, $Si_2H_6$, $Si(OCH_2CH_3)_4$, $Si(OCH_3)_4$, $SiH(OCH_3)_3$, $SiH(OC_2H_5)_3$, $(CH_3)_2Si(OCH_3)_2$, $Si(NCO)_4$, $Si(OC_2H_5)_4$, $H_2N(CH_2)_3Si(OC_2H_5)_3$, $CH_2=CHSi(OCH_3)_3$, $(CH_2=CH)_3SiOCH_3$, $((CH_3)_3CO)_3SiOH$, $(CH_3CH_2C(CH_3)_2O)_3SiOH$, $SiH[N(CH_3)_2]_3$, $SiH_2[N(CH_3)_2]_2$, $SiH_2[NH(C_4H_9)]_2$, $SiH_2[N(C_2H_5)_2]_2$, $SiH_2[NC_2H_5CH_3]_2$, $SiH_3N(C_4H_9)_2$, $[Si(NHC_2H_5)_3]_2$, $Si(NHC_2H_5)_4$, $SiH_3N(C_3H_7)_2$, $[SiH_2N(C_3H_7)_2]_2$, $Si(N(CH_3)_2)_4$, $(CH_3)_3SiN(CH_3)_2$, $C_7H_{17}NSi$, $C_8H_{20}N_2Si$, $C_8H_{17}NO_2Si$, $C_7H_{18}N_2O_2Si$, $SiCl_3H$, $SnCl_4$, $GeCl_3$, $CrO_2Cl_2$, $BBr_3$, $TiF_4$, $TiCl_4$, $TiI_4$, $Ti(OCH_3)_4$, $Ti(OC_2H_5)_4$, $Ti(N(CH_3)_2)_4$, $Ti(N(C_2H_5)_2)_4$, $Ti(N(CH_3)(C_2H_5))_4$, $VOCl_3$, $Zn$, $ZnCl_2$, $Zn(CH_3)_2$, $Zn(C_2H_5)_2$, $ZnI_2$, $ZrCl_4$, $ZrI_4$, $Zr(N(CH_3)_2)_4$, $Zr(N(C_2H_5)_2)_4$, $Zr(N(CH_3)(C_2H_5))_4$, $HfCl_4$, $HfI_4$, $Hf(NO_3)_4$, $Hf(N(CH_3)(C_2H_5))_4$, $Hf(N(CH_3)_2)_4$, $Hf(N(C_2H_5)_2)_4$, $TaCl_5$, $TaF_5$, $TaI_5$, $Ta(O(C_2H_5))_5$, $Ta(N(CH_3)_2)_5$, $Ta(N(C_2H_5)_2)_5$, and $TaBr_5$.

In the embodiments of this application, the first reactant is introduced in a gaseous state. If the first reactant is a solid or liquid at room temperature, the first reactant can be converted into a gas through the following methods: heating, magnetron sputtering, or the like.

In some embodiments, the second reactant includes at least one of and/or plasma of at least one of $H_2O$, $O_2$, $O_3$, $H_2$, $S$, $(NH_4)_2S$, $H_2Se$, $Se$, $H_2Te$, $Te$, $HF$, $TiF_4$, $TaF_5$, $C_2H_4$, $CHCl_3$, $H_2O_2$, $NO_2$, $N_2O$, $NH_3$, $N_2H_4$, $HCOOH$, $CH_3COOH$, and $H_2S$.

With the first reactant and the second reactant selected, the composition of the protection layer can be controlled and the protection layer is uniformly dense and has a strong adhesion with the substrate, thereby reducing the probability of corrosion and short circuit inside the secondary battery.

In the embodiments of this application, the substrate refers to the internal surface of the secondary battery.

In some embodiments, in the steps (1)-(4), the temperature of the secondary battery is maintained at a temperature between 0° C. and 200° C. With the temperature maintained within the given range, the secondary battery thereby adapts to physical parameters of the specific reactants.

In some embodiments, the steps (1)-(4) are repeated 1-100,000 times. Controlling the number of repetitions of the steps (1)-(4) can control the thickness of the protection layer.

In some embodiments, the steps (1)-(2) are first repeated 1-10 times, and then the steps (1)-(4) are repeated 1-100,000 times. The steps (1)-(2) are first repeated, so that the moisture inside the secondary battery can be fully utilized as a reactant.

In some embodiments, the first reactant and the second reactant are introduced by using a carrier gas, the carrier gas including at least one of nitrogen, argon, carbon dioxide, and helium. The usage of the carrier gas to introduce the first reactant and the second reactant can promote a smoother entry of the reactants into the secondary battery.

In some embodiments, prior to the step (1), the protection method further includes a step of pre-treating the internal surface of the secondary battery, including introducing at least one of and/or plasma of at least one of $Ar$, $N_2$, $H_2O$, $O_2$, $O_3$, $H_2$, $S$, $(NH_4)_2S$, $H_2Se$, $Se$, $H_2Te$, $Te$, $HF$, $TiF_4$, $TaF_5$, $C_2H_4$, $CHCl_3$, $H_2O_2$, $NO_2$, $N_2O$, $NH_3$, $N_2H_4$, $HCOOH$, $CH_3COOH$, and $H_2S$ into the secondary battery through the injection opening 13.

To further improve the adhesion between the protection layer and the substrate, pre-treatment may be performed. As the pre-treatment, in this application, prior to the formation of the protection layer, plasma treatment is performed on the internal surface of the secondary battery, including a gas such as oxygen, water, or nitrogen, to make organic compound monomers into plasma, so as to perform surface treatment, corona discharge treatment, UV irradiation treatment, ozone treatment, or the like, which helps to form a compound layer with high bonding strength. The activity and number of reactive groups can be adjusted according to the treatment intensity and time.

In some embodiments, the pre-treatment step may include adjusting the gas type for cleaning of a to-be-deposited surface, including cleaning with plasma such as Ar, $N_2$, $H_2$, and $O_2$. For example, for cleaning with Ar plasma, Ar plasma is generated by a radio frequency plasma gun with a power of 10-1000 W, a frequency of 13.56 MHz, and a duration of 5 s-60 s.

In some embodiments, the protection layer is formed at connections between the tabs 41, 42 and the adapting pieces 21, 22, at connections between the adapting pieces 21, 22 and the top cover assembly 10, at the connection between the top cover assembly 10 and the housing 50, at the inner wall of the top cover assembly 10, on the adapting pieces 21, 22, at the inner wall of the housing 50, and at the outer peripheral surface of the electrode assembly 30.

In some embodiments, the protection layer is formed at the inner wall of the top cover assembly 10, the inner wall of the housing 50, end surfaces of the positive and negative electrode plates, the separator edge, surfaces of the positive and negative electrode tabs 41, 42, welds between the positive and negative electrode tabs 41, 42 and the positive and negative electrode adapting pieces 21, 22, respectively, surfaces of the positive and negative pole adapter pieces 21, 22, welds between the positive and negative electrode adapting pieces 21, 22 and the positive and negative electrode poles 11, 12 of the top cover assembly 10, respectively, and the weld between the top cover assembly 10 and the housing 50.

In the method of this application, the internal surface of the secondary battery can also be covered, especially the surfaces that will only be formed during subsequent assembly, for example, surfaces at the welds between the components. On the one hand, the protection layer can reduce the heat generated during short circuit contact to reduce safety hazards, and on the other hand, the protection layer acts as a physical barrier to prevent the occurrence of corrosion.

In some embodiments, the protection layer includes at least one of carbides, nitrides, sulfides, oxides, fluorides, selenides, and tellurides of aluminum, silicon, tin, germanium, chromium, boron, titanium, vanadium, zinc, zirconium, hafnium, or tantalum, and optionally includes at least one of aluminum oxide, silicon oxide, silicon nitride, titanium oxide, and zinc oxide. With the controlled composition of the protection layer, the protection layer can be made more uniformly dense and the adhesion between the protection layer and the substrate can be increased.

In some embodiments, the protection method further includes a step of purging the secondary battery with a purge gas after the step (2) and/or the step (4), the purge gas including at least one of $N_2$, Ar, He, $CO_2$, and the second reactant. The purging step can further improve the purity and adhesion of the protection layer.

In some embodiments, the step of purging includes a step of introducing and evacuating a purge gas after the first reactant and/or the second reactant is introduced. Purging parameters include: flow rate of the purge gas, that may be 0.01-1000 sccm depending on the cell size, and introduction time, that optionally is 0.1 ms-120 min.

In some embodiments, the thickness of the protection layer is 1 nm-1000 μm, optionally 50 nm-500 nm. With the protection layer controlled in a suitable thickness range, the overall mass energy density and volumetric energy density of the secondary battery are barely affected while insulation and protection are provided.

In some embodiments, the protection method further includes a step of performing post-treatment on the protection layer, including temperature annealing treatment, plasma annealing treatment, or light radiation annealing treatment in a specific atmosphere, where the specific atmosphere includes at least one of and/or plasma of at least one of pyridine, $N_2$, Ar, He, $CO_2$, and the second reactant. The post-treatment step can further improve the quality of the protection layer.

In some embodiments, the temperature annealing treatment includes constant temperature (80-120° C.) annealing (10 min-12 h), alternating high and low temperature annealing (high temperature may be 80-120° C., low temperature may be 25-80° C., and treatment time is 10 min-12 h), and the like.

In some embodiments, the plasma annealing treatment includes direct current pulse plasma treatment, radio frequency plasma treatment, electron cyclotron resonance plasma treatment, and the like, generally with a power of 5-2000 W and a treatment time of 1-120 s.

In some embodiments, the light radiation annealing treatment includes laser annealing treatment, specifically characterized by continuous fiber laser with a power $P_{max}$=5 W, a focused spot r=200 μm, a scanning speed of 0.01-1 mm/s, and a cumulative treatment time per unit area of 1-300 s.

An embodiment of this application further provides a protection device for a secondary battery, including:
  a cavity for accommodating the secondary battery;
  a first reactant tank for storing a first reactant;
  a second reactant tank for storing a second reactant;
  a vacuum pump;
  a pressure gauge for real-time monitoring of the pressure within the secondary battery; and
  a flow regulating valve for regulating the flow rate of the first reactant and the second reactant;
  the second reactant being capable of reacting with the first reactant to form the protection layer, where
  the first reactant tank and the second reactant tank are respectively in communication with an injection opening of the secondary battery accommodated in the cavity for introducing the first reactant and the second reactant into the secondary battery; and the vacuum pump is in communication with the injection opening of the secondary battery accommodated in the cavity for evacuating the secondary battery.

The device of this application firstly can meet the requirements for reaction protection, including: clamping of the unfilled secondary battery, temperature adjustment, real-time monitoring of air pressure, adjustment of the amount of each reactant, and high air tightness of the pipelines; and secondly, the device is simple, which simplifies the protection process for the unfilled secondary battery, improves efficiency, reduces cost, and facilitates industrial production.

Figure 7:
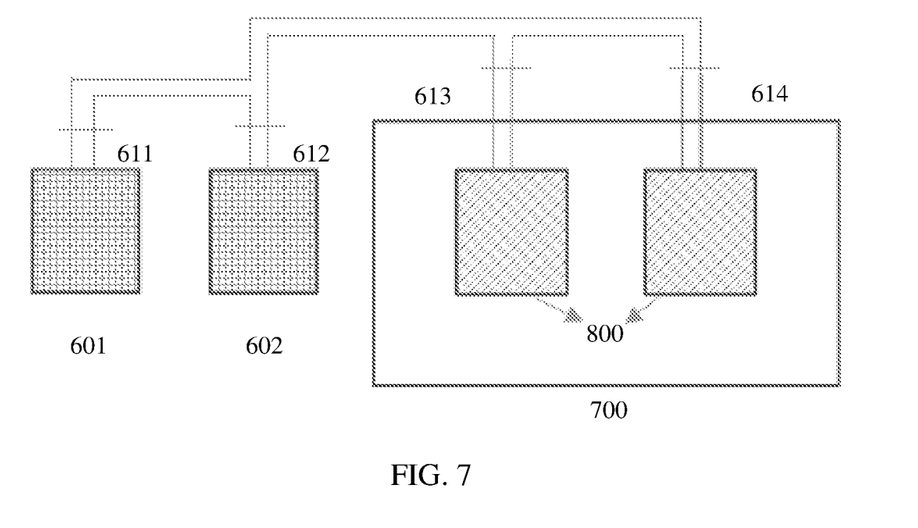
FIG. 7 is a schematic diagram of a protection device for a secondary battery according to an embodiment of this application.

FIG. 7 is a schematic diagram of a protection device for a secondary battery according to an embodiment of this application. As shown in FIG. 7, the device includes a cavity 700 for accommodating a secondary battery 800; a first reactant tank 601 for storing a first reactant and a second reactant tank 602 for storing a second reactant, the first and second reactant tanks being respectively in communication with the injection opening of the secondary battery 800 accommodated in the cavity for introducing the first and second reactants into the secondary battery; a vacuum pump (not shown), which may be in communication with the injection opening of the secondary battery accommodated in the cavity for evacuating the secondary battery; a pressure gauge (not shown) for real-time monitoring of the pressure within the secondary battery; and flow rate regulating valves 611, 612, 613, and 614 for regulating the flow rate of the first reactant and the second reactant.

In some embodiments, the device further includes a pressure gauge for real-time monitoring of the pressure of the first and second reactant tanks.

In some embodiments, the number of reactant tanks may be increased or decreased depending on types of reactants. For example, a third reactant tank may also be included for storing a third reactant for deposition.

In addition, the following describes a secondary battery, a battery module, a battery pack, and an electric apparatus in this application with appropriate reference to the accompanying drawings.

An embodiment of this application provides a secondary battery, the secondary battery being a secondary battery obtained through protection using the method according to the first aspect of this application.

Normally, the secondary battery includes a positive electrode plate, a negative electrode plate, an electrolyte, and a separator. In a charge and discharge process of the battery, active ions are intercalated and deintercalated between the positive electrode plate and the negative electrode plate. The electrolyte conducts ions between the positive electrode plate and the negative electrode plate. The separator is disposed between the positive electrode plate and the negative electrode plate to mainly prevent a short circuit between positive and negative electrodes and to allow the ions to pass through.

[Positive Electrode Plate]

The positive electrode plate may include a positive electrode current collector and a positive electrode film layer provided on at least one surface of the positive electrode current collector, and the positive electrode film layer includes a positive electrode active material.

For example, the positive electrode current collector includes two opposite surfaces in its thickness direction, and the positive electrode film layer is disposed on either or both of the two opposite surfaces of the positive electrode current collector.

In some embodiments, the positive electrode current collector may be a metal foil current collector or a composite current collector. For example, an aluminum foil may be used as the metal foil. The composite current collector may include a polymer material matrix and a metal layer formed on at least one surface of the polymer material matrix. The composite current collector may be formed by forming a metal material (aluminum, aluminum alloy, nickel, nickel alloy, titanium, titanium alloy, silver, silver alloy, or the like) on a polymer material matrix (for example, matrices of polypropylene (PP), polyethylene terephthalate (PET), polybutylene terephthalate (PBT), polystyrene (PS), and polyethylene (PE)).

In some embodiments, the positive electrode active material may be a positive electrode active material for batteries well-known in the art. For example, the positive electrode active material may include at least one of the following materials: olivine-structured lithium-containing phosphate, lithium transition metal oxide, and respective modified compounds thereof. However, this application is not limited to these materials, and other materials that can be used as positive electrode active materials for batteries may alternatively be used, such as positive materials for sodium ion batteries. One type of these positive electrode active materials may be used alone, or two or more of them may be used in combination. Examples of the lithium transition metal oxide may include but are not limited to at least one of lithium cobalt oxide (for example, $LiCoO_2$), lithium nickel oxide (for example, $LiNiO_2$), lithium manganese oxide (for example, $LiMnO_2$ and $LiMn_2O_4$), lithium nickel cobalt oxide, lithium manganese cobalt oxide, lithium nickel manganese oxide, lithium nickel cobalt manganese oxide (for example, $LiNi_{1/3}Co_{1/3}Mn_{1/3}O_2$ (NCM333 for short), $LiNi_{0.5}Co_{0.2}Mn_{0.3}O_2$ (NCM523 for short), $LiNi_{0.5}Co_{0.25}Mn_{0.25}O_2$ (NCM211 for short), $LiNi_{0.6}Co_{0.2}Mn_{0.2}O_2$ (NCM622 for short), and $LiNi_{0.8}Co_{0.1}Mn_{0.1}O_2$ (NCM811 for short)), lithium nickel cobalt aluminum oxide (for example, $LiNi_{0.85}Co_{0.15}Al_{0.05}O_2$), and modified compounds thereof. Examples of the olivine-structured lithium-containing phosphate may include but are not limited to at least one of lithium iron phosphate (for example, $LiFePO_4$ (LFP for short)), a composite material of lithium iron phosphate and carbon, lithium manganese phosphate (for example, $LiMnPO_4$), composite materials of lithium manganese phosphate and carbon, lithium manganese iron phosphate, and composite materials of lithium manganese iron phosphate and carbon.

In some embodiments, the positive electrode film layer further optionally includes a binder. For example, the binder may include at least one of polyvinylidene fluoride (PVDF), polytetrafluoroethylene (PTFE), vinylidene fluoride-tetrafluoroethylene-propylene terpolymer, vinylidene fluoride-hexafluoropropylene-tetrafluoroethylene terpolymer, tetrafluoroethylene-hexafluoropropylene copolymer, and fluorine-containing acrylic resin.

In some embodiments, the positive electrode film layer further optionally includes a conductive agent. For example, the conductive agent may include at least one of superconducting carbon, acetylene black, carbon black, Ketjen black, carbon dots, carbon nanotubes, graphene, and carbon nanofiber.

In some embodiments, the positive electrode plate may be prepared in the following manner: the foregoing constituents used for preparing the positive electrode plate, for example, the positive electrode active material, the conductive agent, the binder, and any other constituent, are dispersed in a solvent (for example, N-methylpyrrolidone) to form a positive electrode slurry; and the positive electrode slurry is applied onto the positive electrode current collector, followed by processes such as drying and cold pressing to obtain the positive electrode plate.

[Negative Electrode Plate]

The negative electrode plate may include a negative electrode current collector and a negative electrode film layer disposed on at least one surface of the negative electrode current collector, where the negative electrode film layer includes a negative electrode active material.

For example, the negative electrode current collector includes two opposite surfaces in its thickness direction, and the negative electrode film layer is disposed on either or both of the two opposite surfaces of the negative electrode current collector.

In some embodiments, the negative electrode current collector may be a metal foil current collector or a composite current collector. For example, for the metal foil, a copper foil may be used. The composite current collector may include a polymer material matrix and a metal layer formed on at least one surface of the polymer material matrix. The composite current collector may be formed by forming a metal material (copper, copper alloy, nickel, nickel alloy, titanium, titanium alloy, silver, silver alloy, or the like) on a polymer material matrix (for example, matrices of polypropylene (PP), polyethylene terephthalate (PET), polybutylene terephthalate (PBT), polystyrene (PS), and polyethylene (PE)).

In some embodiments, the negative electrode active material may be a well-known negative electrode active material used for a battery in the art. In an example, the negative electrode active material may include at least one of the following materials: artificial graphite, natural graphite, soft carbon, hard carbon, a silicon-based material, a tin-based material, lithium titanate, and a lithium metal negative electrode. The silicon-based material may be selected from at least one of elemental silicon, silicon-oxygen compound, silicon-carbon composite, silicon-nitrogen composite, and silicon alloy. The tin-based material may be selected from at least one of elemental tin, tin-oxygen compound, and tin alloy. However, this application is not limited to these materials, but may use other conventional materials that can be used as negative electrode active materials for batteries instead. One of these negative electrode active materials may be used alone, or two or more of them may be used in combination.

In some embodiments, the negative electrode film layer may further optionally include a binder. The binder may be selected from at least one of styrene-butadiene rubber (SBR), polyacrylic acid (PAA), polyacrylic acid sodium (PAAS), polyacrylamide (PAM), polyvinyl alcohol (PVA), sodium alginate (SA), polymethacrylic acid (PMAA), and carboxymethyl chitosan (CMCS).

In some embodiments, the negative-electrode film layer further optionally includes a conductive agent. The conductive agent may be selected from at least one of superconducting carbon, acetylene black, carbon black, Ketjen black, carbon dots, carbon nanotubes, graphene, and carbon nanofiber.

In some embodiments, the negative electrode film layer may further optionally include other promoters such as a thickener (for example, sodium carboxymethyl cellulose (CMC-Na)).

In some embodiments, the negative electrode plate may be prepared in the following manner: the constituents used for preparing the negative electrode plate, for example, the negative electrode active material, the conductive agent, the binder, and any other constituent, are dispersed in a solvent (for example, deionized water) to form a negative electrode slurry; and the negative electrode slurry is applied onto the negative electrode current collector, followed by processes such as drying and cold pressing to obtain the negative electrode plate.

[Electrolyte]

The electrolyte conducts ions between the positive electrode plate and the negative electrode plate. The electrolyte is not specifically limited to any particular type in this application, and may be selected based on needs. For example, the electrolyte may be in a liquid state, a gel state, or an all-solid state.

In some embodiments, the electrolyte is a liquid electrolyte. The liquid electrolyte includes an electrolytic salt and a solvent.

In some embodiments, the electrolytic salt may be selected from at least one of lithium hexafluorophosphate, lithium tetrafluoroborate, lithium perchlorate, lithium hexafluoroborate, lithium bis(fluorosulfonyl)imide, lithium bis-trifluoromethanesulfon imide, lithium trifluoromethanesulfonate, lithium difluorophosphate, lithium difluorooxalatoborate, lithium bisoxalatoborate, lithium difluorobisoxalate phosphate, and lithium tetrafluoro oxalate phosphate.

In some embodiments, the solvent may be selected from at least one of ethylene carbonate, propylene carbonate, ethyl methyl carbonate, diethyl carbonate, dimethyl carbonate, dipropyl carbonate, methyl propyl carbonate, ethyl propyl carbonate, butylene carbonate, fluoroethylene carbonate, methyl formate, methyl acetate, ethyl acetate, propyl acetate, methyl propionate, ethyl propionate, propyl propionate, methyl butyrate, ethyl butyrate, 1,4-butyrolactone, sulfolane, methyl sulfonyl methane, ethyl methanesulfonate, and diethyl sulfone.

In some embodiments, the liquid electrolyte further optionally includes an additive. For example, the additive may include a negative electrode film-forming additive, a positive electrode film-forming additive, or may include an additive that can improve some performance of a battery, for example, an additive for improving over-charge performance of the battery and an additive for improving high-temperature performance or low-temperature performance of the battery.

[Separator]

In some embodiments, the secondary battery further includes a separator. The separator is not limited to any particular type in this application, and may be any well-known porous separator with good chemical stability and mechanical stability.

In some embodiments, a material of the separator may be selected from at least one of glass fiber, non-woven fabric, polyethylene, polypropylene, and polyvinylidene fluoride. The separator may be a single-layer film or a multi-layer composite film, and is not particularly limited. When the separator is a multi-layer composite film, all layers may be made of same or different materials, which is not particularly limited.

In some embodiments, the positive electrode plate, the negative electrode plate, and the separator may be made into an electrode assembly through winding or lamination.

In some embodiments, the secondary battery may include an outer package. The outer package is used for packaging the electrode assembly and the electrolyte.

In some embodiments, the outer package of the secondary battery may be a hard shell, for example, a hard plastic shell, an aluminum shell, or a steel shell. The outer package of the secondary battery may alternatively be a soft package, for example, a soft pouch. Material of the soft package may be plastic, which, for example, may be polypropylene, polybutylene terephthalate, and polybutylene succinate.

Figure 2:
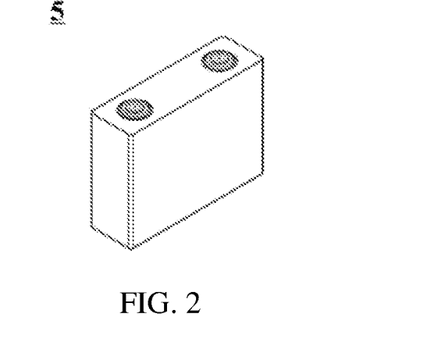
FIG. 2 is a schematic diagram of a secondary battery according to an embodiment of this application.

This application does not impose any special limitations on a shape of the secondary battery, and the secondary battery may be cylindrical, rectangular, or of any other shapes. For example, FIG. 2 shows a secondary battery 5 of a rectangular structure as an example. In addition, the secondary battery of this application is not limited to hard-shell type batteries, but may also include soft package type batteries and other battery forms.

In some embodiments, the secondary battery may be assembled into a battery module, and the battery module may include one or more secondary batteries. The specific quantity may be chosen by persons skilled in the art according to use and capacity of the battery module.

Figure 3:
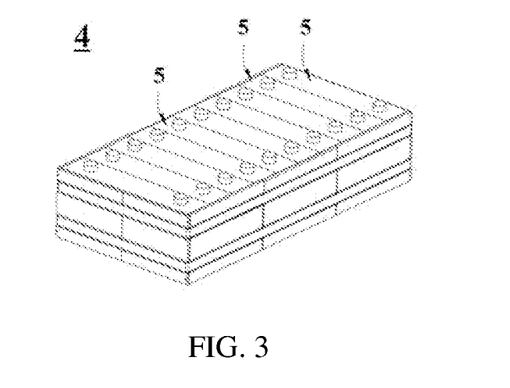
FIG. 3 is a schematic diagram of a battery module according to an embodiment of this application.

FIG. 3 shows a battery module 4 as an example. Referring to FIG. 3, in the battery module 4, a plurality of secondary batteries 5 may be sequentially arranged in a length direction of the battery module 4. Certainly, the batteries may alternatively be arranged in any other manners. Further, the plurality of secondary batteries 5 may be fastened by using fasteners.

Optionally, the battery module 4 may further include a housing with accommodating space, and the plurality of secondary batteries 5 are accommodated in the accommodating space.

In some embodiments, the battery module may be further assembled into a battery pack, and the battery pack may include one or more battery modules. The specific quantity may be chosen by persons skilled in the art according to use and capacity of the battery pack.

Figure 4:
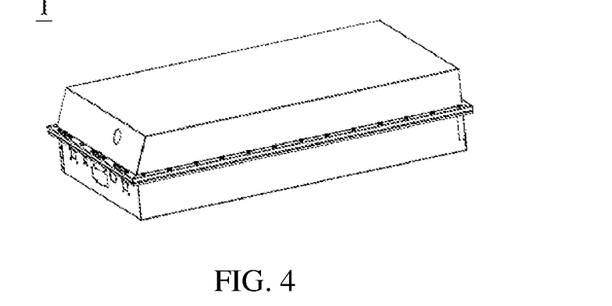
FIG. 4 is a schematic diagram of a battery pack according to an embodiment of this application.
Figure 5:
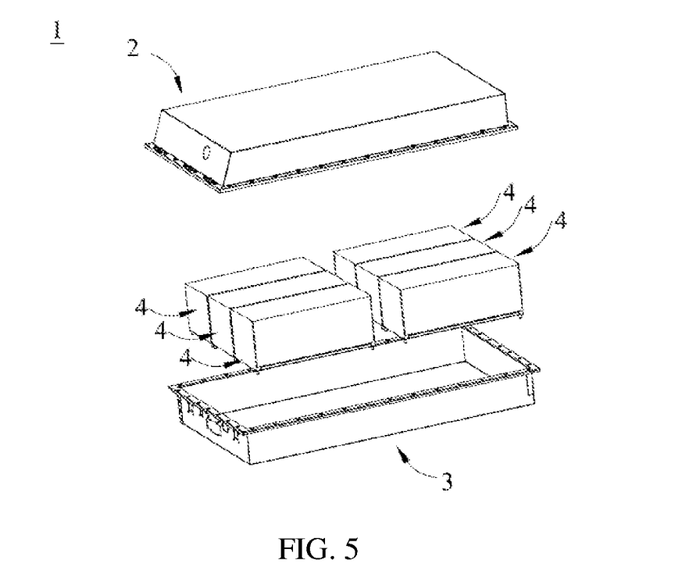
FIG. 5 is an exploded view of the battery pack according to the embodiment of this application in FIG. 4.

FIG. 4 and FIG. 5 show a battery pack 1 as an example. Referring to FIG. 4 and FIG. 5, the battery pack 1 may include a battery box and a plurality of battery modules 4 arranged in the battery box. The battery box includes an upper box body 2 and a lower box body 3. The upper box body 2 can cover the lower box body 3 to form an enclosed space for accommodating the battery module 4. The plurality of battery modules 4 may be arranged in the battery box in any manner.

In addition, this application further provides an electric apparatus. The electric apparatus includes at least one of the secondary battery, the battery module, or the battery pack provided in this application. The secondary battery, the battery module, or the battery pack may be used as a power source for the electric apparatus or an energy storage unit of the electric apparatus. The electric apparatus may include a mobile device (for example, a mobile phone or a notebook computer), an electric vehicle (for example, a battery electric vehicle, a hybrid electric vehicle, a plug-in hybrid electric vehicle, an electric bicycle, an electric scooter, an electric golf vehicle, or an electric truck), an electric train, a ship, a satellite system, an energy storage system, or the like, but is not limited thereto.

The secondary battery, the battery module, or the battery pack may be selected for the electric apparatus based on requirements for using the electric apparatus.

Figure 6:
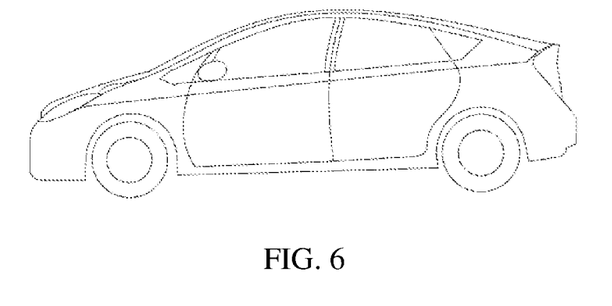
FIG. 6 is a schematic diagram of an electric apparatus using a secondary battery as a power source according to an embodiment of this application.

FIG. 6 shows an electric apparatus as an example. This electric apparatus is a battery electric vehicle, a hybrid electric vehicle, a plug-in hybrid electric vehicle, or the like. To satisfy a requirement of the electric apparatus for high power and high energy density of the secondary battery, a battery pack or a battery module may be used.

In another example, the apparatus may be a mobile phone, a tablet computer, a notebook computer, or the like. The apparatus usually requires to be light and thin, and a secondary battery may be used as a power source.

EXAMPLES

The following describes examples of this application with reference to the accompanying drawings. The examples described below are illustrative and only used for explaining this application, and cannot be construed as limitations on this application. Examples whose technical solutions or conditions are not specified are made in accordance with technical solutions or conditions described in literature in the field or made in accordance with product instructions. The reagents or instruments used are all conventional products that are commercially available if no manufacturer is indicated.

Example 1

[Preparation of Positive Electrode Plate]

The positive electrode active material $LiNi_{1/3}Co_{1/3}Mn_{1/3}O_2$ (NCM333), conductive carbon black, and the binder polyvinylidene fluoride (PVDF) at a weight ratio of 93:2:5 were fully stirred and mixed in an appropriate amount of N-methylpyrrolidone (NMP) solvent to form a uniform positive electrode slurry. The positive electrode slurry was applied onto a 12 μm thick aluminum foil, followed by drying and other processes to obtain a positive electrode plate.

[Preparation of Negative Electrode Plate]

The negative electrode active material graphite, conductive carbon black, the thickener sodium carboxymethyl cellulose (CMC), and the binder styrene butadiene rubber (SBR) at a weight ratio of 96.5:1.0:1.0:1.5 were fully stirred and mixed in an appropriate amount of deionized water to form a uniform negative electrode slurry. The negative electrode slurry was applied onto an 8 μm thick copper foil, followed by drying and other processes to obtain a negative electrode plate.

[Preparation of Unfilled Secondary Battery]

The positive electrode plate, separator (20 μm thick PP/PE/PP composite film), and negative electrode plate were sequentially stacked together and then wound to obtain an electrode assembly. The electrode assembly itself had aluminum positive electrode tabs and copper negative electrode tabs. The positive and negative electrode tabs were respectively welded to the aluminum positive electrode adapting piece and the copper negative electrode adapting piece, and then the positive and negative electrode adapting pieces were respectively welded to the positive and negative electrode poles of the top cover assembly. Finally, the top cover assembly was welded to the housing by laser welding to obtain an unfilled secondary battery, which was connected to the outside world through the injection opening on the top cover assembly.

[Protection for Internal Surface of Unfilled Secondary Battery]

A protection device for a secondary battery is used to protect the internal surface of the unfilled secondary battery. The device includes a cavity for accommodating the secondary battery; a first reactant tank for storing a first reactant and a second reactant tank for storing a second reactant, the first and second reactant tanks being respectively in communication with the injection opening of the secondary battery accommodated in the cavity for introducing the first and second reactants into the secondary battery; a vacuum pump, which may be in communication with the injection opening of the secondary battery accommodated in the cavity for evacuating the secondary battery; a pressure gauge for real-time monitoring of the pressure within the unfilled secondary battery; and flow rate regulating valves for regulating the flow rate of the first reactant and the second reactant. Protecting the internal surface of the unfilled secondary battery includes the following steps:

step (1): controlling the temperature of the unfilled secondary battery at 70° C. and evacuating the unfilled secondary battery to 50 Pa through an injection opening;

step (2): introducing a first reactant, gaseous trimethylaluminum, into the unfilled secondary battery through the injection opening until the pressure rose by 100 Pa and maintaining the pressure for 1 s;

step (3): evacuating the unfilled secondary battery to 50 Pa through the injection opening; and step (4): introducing a second reactant, water vapor, into the unfilled secondary battery through the injection opening until the pressure rose by 100 Pa and maintaining the pressure for 5 s; where the steps (1)-(4) were repeated for a total of 1000 times to form an alumina protection layer of nanometer-scale thickness on the internal surface of the unfilled secondary battery.

[Preparation of Finished Secondary Battery]

The electrolyte (with an EC:EMC volume ratio of 3:7 and $LiPF_6$ of 1 mol/L) was injected into the unfilled secondary battery with the foregoing protection, followed by processes such as sealing, standing, hot and cold pressing, and formation to obtain a lithium-ion secondary battery.

Examples 2-11

The preparation methods of the secondary batteries in Examples 2-11 were similar to that of the secondary battery in Example 1 except that the conditions were adjusted in protecting the internal surface of the unfilled secondary battery. For details, refer to Table 1.

Example 12

The preparation method of the secondary battery in Example 12 was similar to that of the secondary battery in Example 1 except that protecting the internal surface of the unfilled secondary battery includes the following steps:

step (1): controlling the temperature of the unfilled secondary battery at 75° C. and evacuating the unfilled secondary battery to 100 Pa through an injection opening;

step (2): introducing a first reactant, gaseous tris(dimethylamino)silane (TDMAS) into the unfilled secondary battery through the injection opening until the pressure rose by 100 Pa and maintaining the pressure for 5 s;

step (3): evacuating the unfilled secondary battery to 50 Pa through the injection opening; and step (4): introducing plasma through the injection opening, where the plasma was generated by performing 13.56 MHz radio frequency discharge in a mixture of Ar and $O_2$ gas, with a radio frequency power of 1000 W, an Ar carrier gas flow rate of 40 mL/min, and an $O_2$ flow rate of 50 mL/min; where the steps (1)-(4) were repeated for a total of 7000 times to form a silicon oxide protection layer of nanometer- and micrometer-scale thickness on the internal surface of the unfilled secondary battery.

Example 13

The preparation method of the secondary battery in Example 13 was similar to that of the secondary battery in Example 12 except that the process conditions were adjusted in protecting the internal surface of the unfilled secondary battery. For details, refer to Table 1.

Example 14

The preparation method of the secondary battery in Example 14 was similar to that of the secondary battery in Example 1 except that in protecting the internal surface of the unfilled secondary battery, the steps (1)-(2) were first repeated 10 times to so that the moisture in the secondary battery was used as a second reactant, and then the steps (1)-(4) were repeated 6990 times in which water vapor was used as a second reactant. For details of other process conditions, refer to Table 1.

Example 15

The preparation method of the secondary battery in Example 15 was similar to that of the secondary battery in Example 1 except that before protecting the internal surface of the unfilled secondary battery, the internal surface of the unfilled secondary battery was pre-treated, including performing Ar plasma cleaning, with Ar plasma generated by a radio frequency plasma gun with a power of 550 W, a frequency of 13.56 MHz, and a duration of 30 s.

Example 16

The preparation method of the secondary battery in Example 16 was similar to that of the secondary battery in Example 1 except that after the step (2) and the step (4), a purging step of introducing and evacuating a purge gas was added. Purging parameters include: a purge gas of $N_2$, a flow rate of 1 sccm, and an introduction time of 10 s. For details of other process conditions, refer to Table 1.

Example 17

The preparation method of the secondary battery in Example 17 was similar to that of the secondary battery in Example 1 except that the protection layer was treated at a high temperature of 105° C. for 8 h.

Comparative Example 1

The preparation method of the secondary battery in Comparative example 1 was similar to that of the secondary battery in Example 1 except that the internal surface of the unfilled secondary battery was not protected.

Parameter Test

1. Thickness of Protection Layer

A scanning electron microscope ZEISS sigma 300 was used, 10 different positions in a test sample were randomly selected for testing, and the average value was taken as the thickness of the protection layer.

2. Composition of Protection Layer

The energy-dispersive x-ray spectroscopy (energy-dispersive x-ray spectroscopy, EDS) accompanied with the scanning electron microscope ZEISS sigma 300 was used for elemental analysis on surface of a relevant region.

3. Resistance Value

A conventional commercial G2A type film resistance meter was used, 10 different positions in the test sample were randomly selected for testing, and the average value was taken.

The secondary batteries obtained in the above examples and comparative example were tested according to the above process, respectively. The specific values are shown in Table 2.

TABLE 1

| Examples | First reactant | Second reactant | Reaction or deposition temperature (° C.) | Cycles |
|---|---|---|---|---|
| Example 1 | Trimethyl aluminum | Water vapor | 70 | 1000 |
| Example 2 | Trimethyl aluminum | Water vapor | 80 | 5000 |
| Example 3 | Trimethyl aluminum | Water Vapor | 90 | 10000 |
| Example 4 | Trimethyl aluminum | Water vapor | 90 | 20000 |
| Example 5 | $AlCl_3$ | Water vapor | 100 | 10000 |
| Example 6 | $SiCl_4$ | Water vapor | 90 | 3000 |
| Example 7 | $Si(OCH_3)_4$ | Ammonia vapor | 75 | 2000 |
| Example 8 | $TiCl_4$ | Water vapor | 80 | 4000 |
| Example 9 | $Ti(OC_2H_5)_4$ | Ammonia vapor | 100 | 3000 |
| Example 10 | $ZnCl_2$ | Water vapor | 95 | 3000 |
| Example 11 | $Zn(CH_3)_2$ | Ammonia vapor | 85 | 4000 |
| Example 12 | Tris(dimethylamino)silane | Oxygen plasma | 75 | 7000 |
| Example 13 | Tris(dimethylamino)silane | Ammonia plasma | 80 | 5000 |
| Example 14 | Trimethyl aluminum | Water vapor inside the battery and water vapor | 70 | 7000 |
| Example 15 | Trimethyl aluminum | Water vapor | 70 | 1000 |
| Example 16 | Trimethyl aluminum | Water vapor | 60 | 2000 |
| Example 17 | Trimethyl aluminum | Water vapor | 70 | 1000 |
| Comparative example | / | / | / | / |

TABLE 2

| | | Protection layer thickness (nm) | | | | Resistance value (Ω) | |
|---|---|---|---|---|---|---|---|
| Examples | Protection layer substance | Inner wall of top cover | Weld between top cover and housing | Positive electrode adapting piece | Negative electrode adapting piece | Inner wall of top cover | Weld Between top cover and housing |
| Example 1 | Aluminum oxide | 81 | 78 | 90 | 92 | $>1.0 \times 10^0$ | $>1.0 \times 10^0$ |
| Example 2 | Aluminum oxide | 507 | 463 | 458 | 471 | $>1.0 \times 10^6$ | $>1.0 \times 10^6$ |
| Example 3 | Aluminum oxide | 913 | 828 | 982 | 945 | $>1.0 \times 10^6$ | $>1.0 \times 10^6$ |
| Example 4 | Aluminum oxide | 1718 | 1803 | 1786 | 1856 | $>1.0 \times 10^6$ | $>1.0 \times 10^6$ |
| Example 5 | Aluminum oxide | 4013 | 4247 | 3893 | 3944 | $>1.0 \times 10^6$ | $>1.0 \times 10^6$ |
| Example 6 | Silicon oxide | 298 | 316 | 273 | 292 | $>1.0 \times 10^5$ | $>1.0 \times 10^5$ |
| Example 7 | Silicon oxide | 683 | 741 | 804 | 772 | $>1.0 \times 10^6$ | $>1.0 \times 10^6$ |
| Example 8 | Titanium oxide | 175 | 197 | 181 | 186 | $>1.4 \times 10^3$ | $>1.4 \times 10^3$ |
| Example 9 | Titanium oxide | 1401 | 1161 | 1384 | 1422 | $>1.0 \times 10^6$ | $>1.0 \times 10^6$ |
| Example 10 | Zinc oxide | 439 | 491 | 479 | 458 | $>1.0 \times 10^6$ | $>1.0 \times 10^6$ |
| Example 11 | Zinc oxide | 389 | 367 | 395 | 420 | $>1.0 \times 10^6$ | $>1.0 \times 10^6$ |
| Example 12 | Silicon oxide | 818.7 | 715 | 903 | 843 | $>1.0 \times 10^6$ | $>1.0 \times 10^6$ |
| Example 13 | Silicon nitride | 683 | 730 | 747 | 781 | $>1.0 \times 10^6$ | $>1.0 \times 10^6$ |
| Example 14 | Aluminum oxide | 452 | 537 | 522 | 429 | $>1.0 \times 10^6$ | $>1.0 \times 10^6$ |
| Example 15 | Aluminum oxide | 96 | 78 | 102 | 93 | $>1.0 \times 10^0$ | $>1.0 \times 10^0$ |
| Example 16 | Aluminum oxide | 155 | 147 | 152 | 143 | $>1.0 \times 10^3$ | $>1.0 \times 10^3$ |
| Example 17 | Aluminum oxide | 74 | 79 | 85 | 89 | $>1.0 \times 10^0$ | $>1.0 \times 10^0$ |
| Comparative Example 1 | \ | \ | \ | \ | \ | <0.01 | <0.01 |

As can be learned from Table 1 and Table 2, in protecting the unfilled secondary battery using the protection method described in this application, an integrated treatment on the exposed internal surface of the battery, particularly on the surfaces of the welds produced during subsequent assembly, may be performed, that is, to form a protection layer on the surfaces. The protection layer makes the resistance of the surfaces higher and can effectively reduce the risk of thermal runaway caused by a short circuit inside the battery, while the protection layer can also mitigate corrosion by the internal components of the battery, such as the electrolyte, thus improving the safety performance of the secondary battery.

It should be noted that this application is not limited to the foregoing embodiments. The foregoing embodiments are merely examples, and embodiments having substantially the same constructions and the same effects as the technical idea within the scope of the technical solutions of this application are all included in the technical scope of this application. In addition, without departing from the essence of this application, various modifications made to the embodiments that can be conceived by persons skilled in the art, and other manners constructed by combining some of the constituent elements in the embodiments are also included in the scope of this application.

What is claimed is:

1. A protection method for a secondary battery comprising an injection opening, the method comprising:
   step (1): evacuating the secondary battery through the injection opening to within 100 kPa, optionally to within 100 Pa;

step (2): introducing a first reactant into the secondary battery through the injection opening until a pressure in the secondary battery rises by more than 1 Pa, optionally more than 1 kPa, and maintaining the pressure for more than 1 ms, optionally for 0.1s-600s; and optionally step (3): evacuating the secondary battery through the injection opening to within 100 kPa again, optionally to within 100 Pa; and step (4): introducing a second reactant into the secondary battery through the injection opening until the pressure rises by more than 1 Pa, optionally more than 1 kPa, and maintaining the pressure for more than 1 ms, optionally for 0.1s-600s;

wherein the second reactant is capable of reacting with the first reactant to form a protection layer on an internal surface of the secondary batter battery.

2. The protection method according to claim 1, wherein the first reactant comprises at least one of a gaseous aluminum compound, silicon compound, tin compound, germanium compound, chromium compound, boron compound, titanium compound, vanadium compound, elemental zinc and zinc compound, zirconium compound, hafnium compound, and tantalum compound.

3. The protection method according to claim 1, wherein the second reactant comprises at least one of and/or plasma of at least one of $H_2O$, $O_2$, $O_3$, $H_2$, S, $(NH_4)_2S$, $H_2Se$, Se, $H_2Te$, Te, HF, $TiF_4$, $TaF_5$, $C_2H_4$, $CHCl_3$, $H_2O_2$, $NO_2$, $N_2O$, $NH_3$, $N_2H_4$, HCOOH, $CH_3COOH$, and $H_2S$.

4. The protection method according to claim 1, wherein in the steps (1)-(4), a temperature of the secondary battery is maintained at a temperature between 0° C. and 200° C.

5. The protection method according to claim 1, wherein the steps (1)-(4) are repeated 1-100,000 times.

6. The protection method according to claim 1, wherein the steps (1)-(2) are first repeated 1-10 times, and then the steps (1)-(4) are repeated 1-100,000 times.

7. The protection method according to claim 1, wherein the first reactant and the second reactant are introduced by using a carrier gas, the carrier gas comprising at least one of nitrogen, argon, carbon dioxide, and helium.

8. The protection method according to claim 1, further comprising, prior to the step (1):

pre-treating the internal surface of the secondary battery, comprising introducing at least one of and/or plasma of at least one of Ar, $N_2$, $H_2O$, $O_2$, $O_3$, $H_2$, S, $(NH_4)_2S$, $H_2Se$, Se, $H_2Te$, Te, HF, $TiF_4$, $TaF_5$, $C_2H_4$, $CHCl_3$, $H_2O_2$, $NO_2$, $N_2O$, $NH_3$, $N_2H_4$, HCOOH, $CH_3COOH$, and $H_2S$ into the secondary battery through the injection opening.

9. The protection method according to claim 1, wherein:
the secondary battery further comprises an electrode assembly, tabs, adapting pieces, a top cover assembly, and a housing; and
the protection layer is formed at connections between the tabs and the adapting pieces, at connections between the adapting pieces and the top cover assembly, at a connection between the top cover assembly and the housing, at an inner wall of the top cover assembly, on the adapting pieces, at an inner wall of the housing, and at an outer peripheral surface of the electrode assembly.

10. The protection method according to claim 1, wherein the protection layer comprises at least one of carbides, nitrides, sulfides, oxides, fluorides, selenides, and tellurides of aluminum, silicon, tin, germanium, chromium, boron, titanium, vanadium, zinc, zirconium, hafnium, or tantalum.

11. The protection method according to claim 1, further comprising:
purging the secondary battery with a purge gas after the step (2) and/or the step (4), the purge gas comprising at least one of $N_2$, Ar, He, $CO_2$, and the second reactant.

12. The protection method according to claim 1, wherein a thickness of the protection layer is 1 nm-1000 μm.

13. The protection method according to claim 1, further comprising:
performing post-treatment on the protection layer, comprising temperature annealing treatment, plasma annealing treatment, or light radiation annealing treatment in a specific atmosphere, wherein the specific atmosphere comprises at least one of and/or plasma of at least one of pyridine, $N_2$, Ar, He, $CO_2$, and the second reactant.

14. A secondary battery, wherein the secondary battery is a secondary battery obtained through protection using the protection method according to claim 1.

15. A battery module, comprising the secondary battery according to claim 14.

16. A battery pack, comprising the battery module according to claim 15.

17. An electric apparatus, comprising the secondary battery according to claim 14.

18. A protection device for a secondary battery, comprising:
a cavity for accommodating the secondary battery;
a first reactant tank for storing a first reactant;
a second reactant tank for storing a second reactant;
a vacuum pump;
a pressure gauge for real-time monitoring of a pressure within the secondary battery; and
a flow regulating valve for regulating a flow rate of the first reactant and a flow rate of the second reactant;
wherein:
the second reactant being capable of reacting with the first reactant to form a protection layer; and
the first reactant tank and the second reactant tank are in communication with an injection opening of the secondary battery accommodated in the cavity for introducing the first reactant and the second reactant into the secondary battery; and the vacuum pump is in communication with the injection opening of the secondary battery accommodated in the cavity for evacuating the secondary battery.

* * * * *